United States Patent [19]
Ho et al.

[11] Patent Number: 5,959,601
[45] Date of Patent: Sep. 28, 1999

[54] METHOD AND APPARATUS FOR PARALLEL IN SERIAL OUT TRANSMISSION

[75] Inventors: Chak Cheung Ho, Markham; Hugh Hin-Poon Chow, Richmond Hill; Ray Chau, Toronto, all of Canada

[73] Assignee: ATI Technologies, Inc, Canada

[21] Appl. No.: 08/820,291

[22] Filed: Mar. 18, 1997

[51] Int. Cl.⁶ .................................................. G09G 3/36
[52] U.S. Cl. ........................... 345/98; 345/100; 345/197
[58] Field of Search .......................... 345/98, 100, 101, 345/211, 197, 198

[56] References Cited

U.S. PATENT DOCUMENTS 4,721,943  1/1988  Stallkamp ................... 345/22
4,745,485  5/1988  Iwasaki ...................... 345/98
5,365,284  11/1994  Matsumoto et al. ............ 345/100

Primary Examiner—Richard A. Hjerpe
Assistant Examiner—Anthony J. Blackman
Attorney, Agent, or Firm—Markison & Reckamp

[57] ABSTRACT

A method and apparatus for providing serial transmission of a parallel input is accomplished by a parallel input serial output transmitter that includes a shift register operably coupled to receive a parallel input and to provide data serially to a gating circuit. The gating circuit, based on the state of the data it receives, generates a drive signal which causes a switching circuit to route current from a first current source to a second current source over different paths to produce a serial output. A bias circuit is coupled to the switching circuit to bias the serial output to a desired level.

12 Claims, 4 Drawing Sheets

METHOD AND APPARATUS FOR PARALLEL IN SERIAL OUT TRANSMISSION

TECHNICAL FIELD OF THE INVENTION

This invention relates generally to transmitters that receive a parallel input and provide a serial output and more particularly to transmitters that provide a serial output for low voltage differential signals.

BACKGROUND OF THE INVENTION

Transmission of data from a processing engine to a display device for subsequent presentation or display is known. For example, data may be transmitted from a video graphics controller, or video graphics processing engine, to an LCD (liquid crystal diode) display panel for subsequent display. Because of the digital nature of the data (eg. binary signaling switching between 0 volts and the voltage supply), electromagnetic interference (EMI) is generated. For relatively small amounts of data transmissions, the resulting EMI is practically negligible (i.e., the EMI does not adversely affect circuit operation and is below EMI levels established by regulatory agencies such as the Federal Communications Commission (FCC)).

As the LCD display increases in size and/or the complexity of the displayed data increases, the amount of data conveyed from the video graphics circuit is similarly increased. Not surprisingly, the generated EMI increases correspondingly to the increase in data transmission. In fact, in many high volume data transmissions, the EMI generated exceeds FCC regulations. Systems, such as computers, that employ the high volume data transmissions that are not FCC compliant are, as a result, not marketable.

To combat the EMI problem created from high volume data transmissions, a standard Low Voltage Differential Signaling (LVDS) for interface circuits has been developed. In particular, TIA/EIA-644 LVDS standard governs LVDS transmissions. The TIA/EIA-644 standard provides general specifications as to the acceptable operating criteria for low voltage differential signaling. Such specifications require that signal transmissions be done using differential signaling, which substantially reduces the affects of the EMI generated by having the differential signals transmitted over a twisted wire pair, or at least an equivalent transmission medium. The specifications also dictate the signaling levels, such as the signal magnitude and the DC offset voltage. While the TIA/EIA-644 provides operational parameters, it does not provide information as to specific circuit implementations.

One TIA/EIA-644 standard compliant circuit uses two pairs of cascaded transistors, which are switched as a full bridge inverter. The interconnecting nodes of each pair of cascaded transistors provides the differential output, while the ends of each of the pair of cascaded transistors are coupled to a current source and circuit return, respectively. The DC offset as specified in the standard is achieved by controlling the conductive impedances of the transistors to provide a voltage divider circuit. While this circuit works well in many applications, controlling the conductive impedances may provide manufacturing difficulties and, if the conductive impedances drift due to manufacturing differences or gate drive circuits, the resulting differential output may not have the specified DC offset.

Therefore a need exists for a method and apparatus that is TIA/EIA-644 compliant and is not heavily dependent on the conductive impedances of the transistors.

DETAILED DESCRIPTION OF THE DRAWINGS

Generally, the present invention provides a method and apparatus for providing serial transmission of a parallel input. This may be accomplished by a parallel input serial output transmitter that includes a shift register operably coupled to receive a parallel input and to provide data serially to a gating circuit. The gating circuit, based on the state of the data it receives, generates a drive signal which causes a switching circuit to route current from a first current source to a second current source over different paths to produce a serial output. A bias circuit is coupled to the switching circuit to bias the serial output to a desired level. By utilizing two current sources and the bias circuit in this fashion, a low voltage differential signaling (LVDS) transmitter that is compliant to TIA/EIA-644 standard is provided and one that is not heavily dependent upon transistor conductive impedances of prior art LVDS transmitters.

Figure 1:
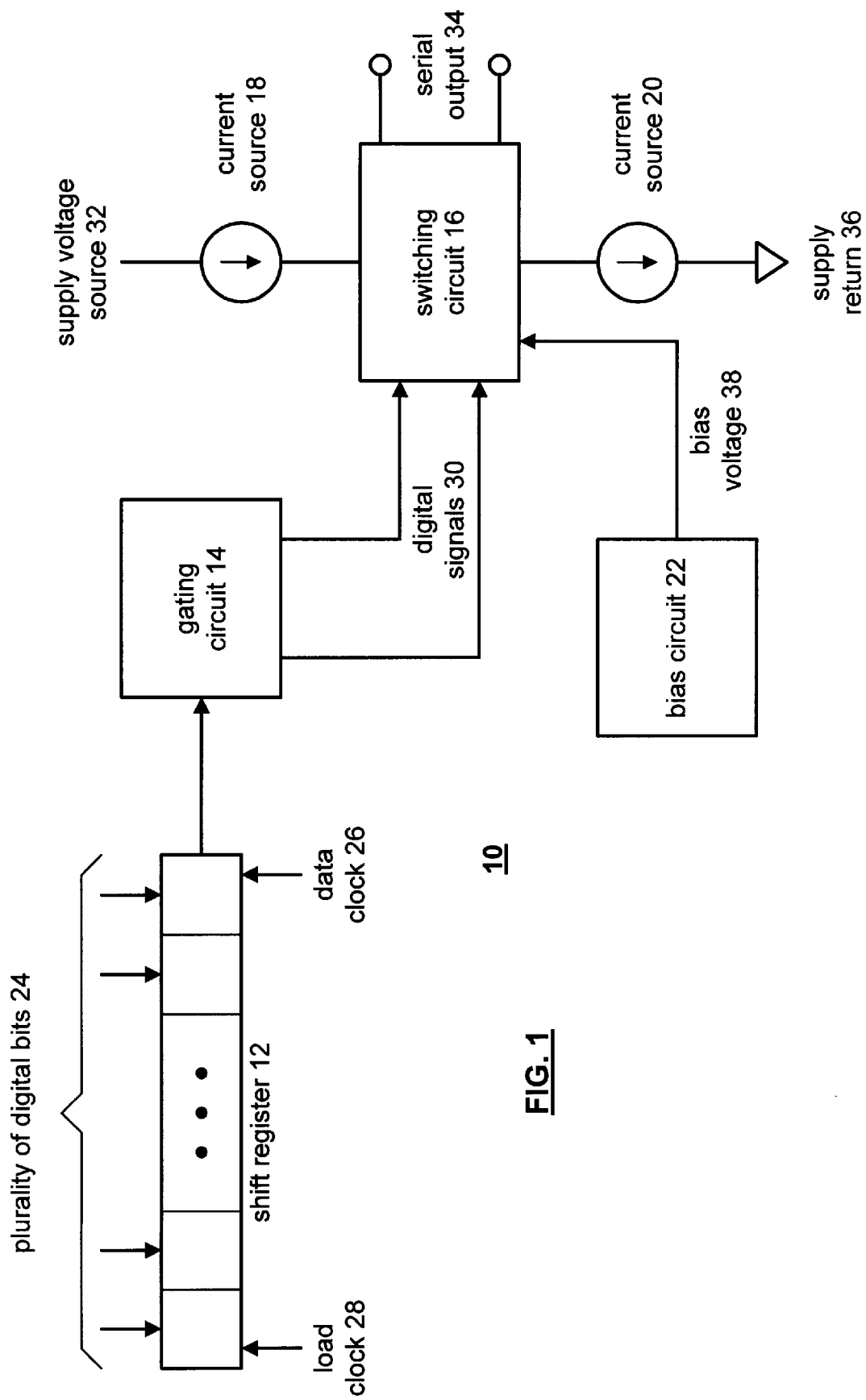
FIG. 1 illustrates a schematic block diagram of a parallel input serial output transmitter which is in accordance with the present invention.

The present invention can be more fully described with reference to FIGS. 1–4. FIG. 1 illustrates a parallel input serial output transmitter 10 that includes a shift register 12, a gating circuit 14, a switching circuit 16, a first current source 18, a second current source 20, and a bias circuit 22. The shift register 12 is operably coupled to receive, in a parallel manner, a plurality of digital bits 24 when the load clock 28 transitions. The load clock 28 may be a system clock for the circuit which employs the transmitter 10 and may have a rate of 1 MHz to 200 MHz. Once the digital bits 12 are loaded into the shift register 12 for this particular cycle, the shift register provides the digital bits 24 in a serial manner to the gating circuit 14 at transitions of the data clock 26. As one skilled in the art will readily appreciate, the data clock rate 26 may be derived from the load clock 28 as being a multiple thereof based on the size of the shift register 12. For example, if the shift register 12 is a seven bit register, the data clock would be seven times the load clock 28. As one skilled in the art will further appreciate, the transitions used to clock in and clock out the bits to/from the shift register may be done on positive edge transitions and/or on negative edge transitions.

Upon receiving a digital bit from the shift register 12, the gating circuit 14 generates drives signals 30 which are subsequently provided to the switching circuit 16. When the digital bit is in a first state, the resulting drive signal 30 causes the switching circuit 16 to route the current from the first current source 18 through a first path, thereby providing a first current direction for the serial output 34. When the digital bit is in a second state, the resulting drive signal 30 causes the switching circuit 16 to route the current from the first current source 18 through a second current path, thereby producing a second current direction for the serial output 34.

To bias the serial output 34, which is a current output, the bias circuit 22 provides a bias voltage 38 to the switching circuit 16. Because of the bias voltage 38, the serial output 34 will be centered about the voltage which is somewhere between a supply voltage 32 and a supply return voltage 36. In particular, to be compliant with TIA/EIA-644, the bias voltage will be set at 1.2 volts. In addition to establishing the DC bias of the output signal, the bias voltage 38 limits, to a degree, the differential swing of the serial output 34. Again, to be compliant with TIA/EIA-644, differential voltage of the bias voltage is set to be 345 m Volts.

Figure 2:
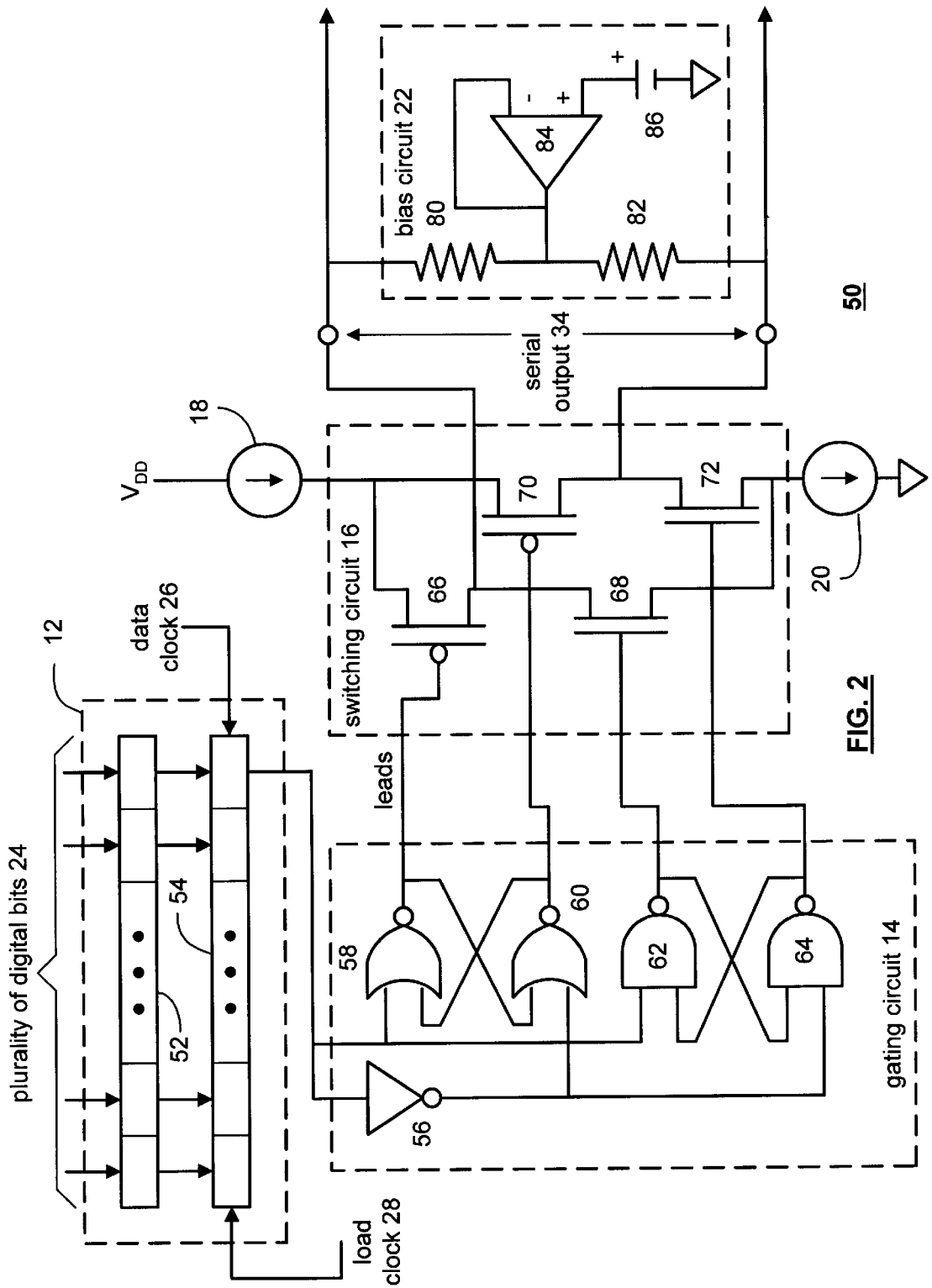
FIG. 2 illustrates a schematic block diagram of a variant embodiment of the parallel input serial output transmitter of FIG. 1.

FIG. 2 illustrates a schematic block diagram of a variant embodiment 50 of the parallel input serial output transmitter of FIG. 1. As shown, the transmitter 50 includes the shift register 12, the gating circuit 14, the switching circuit 16, the first current source 18, the second current source 20, and the bias circuit 22. The shift register 12 includes a buffer 52 and a register 54 wherein the digital bits 24 can be loaded into the buffer 52 in an asynchronous manner and loaded into the register 54 when the load clock 28 transitions. As such, whatever data is present in the buffer 52 when the load clock transitions will be loaded into the register 54.

As data is shifted through the shift register 12, which is done at the rate of the data clock 26, the last bit location of the register 54 is provided to the gating circuit 14. The gating circuit 14, which includes a pair of NOR gates 58 and 60, a pair of NAND gates 62 and 64, and an inverter 56, produces a plurality of drive signals based on the state of the received bit. For example, if the bit is a logic "1", the output of NOR gate 58 is a logic "0", the output of NOR gate 60 is a logic "1", the output of NAND gate 62 is a logic "0", and the output of NAND gate 64 is a logic "1". When the received bit is a logic "0", the output of NOR gate 58 is a logic "1", the output of NOR gate 60 is a logic "0", the output of NAND gate 62 is a logic "1", and the output of NAND gate 64 is a logic "0". Note that, due to the output-to-input coupling of the NOR gates and of the NAND gates, non-overlapping off signals are created such that transistors 68 and 72 are never off together and transistors 66 and 70 are never off together.

The four drive signals produced by the gating circuit 14 are provided to four transistors 66, 68, 70, and 72 within the switching circuit 16. As shown, the transistors are coupled in two pairs of cascaded transistors with the interconnection node of each pair providing one of the serial output 34 terminals. As is also shown, one end of the transistor pairs is coupled to the first current source 18, while the other end is coupled to the second current source 20. The four drive signals produced when the digital bits is a logic "1" turns on transistors 66 and 72, while holding off transistors 70 and 68.

When transistors 66 and 72 are on, current flows from the first current source 18 through transistor 66 out the top terminal of the serial output 34 to a load coupled to the serial output 34 returning through the bottom terminal of the serial output 34 to the second current source 20. This provides the first current path.

When the digital bit is a logic "0", transistors 70 and 68 are on while transistors 66 and 72 are held off. In this configuration, current from the first current source 18 flows through transistor 70 out the bottom terminal of the serial output 34 to the load returning through the top terminal of the serial output 34. The current continues to flow through transistor 68 to the second current source 20. This provides the second current path.

The bias circuit 22 is shown to include a voltage source 86, a unity gain amplifier 84, and a pair of substantially matched cascaded impedances 80 and 82, which may be resistors. The voltage source 86, which may be a voltage reference of 1.2 volts, is coupled to the input of the unity gain amplifier 84. The output of the unity gain amplifier 84 is coupled to the interconnection of the impedances 80 and 82. Each end of the pair of impedances is coupled to one of the serial output 34 terminals.

Analyzing the operation of the bias circuit 22 in conjunction with the switching circuit 16, one can see how the bias circuit establishes, not only the DC offset voltage for the serial output, but also the magnitude of the differential voltage swing. It must first be understood that the first and second current sources 18 and 20 are high impedance circuits, from the perspective of the switching circuit 16. As such, the serial output 34 produced by the switching circuit 16 is "free to float" between the supply voltage and the supply return. The bias circuit 22 centers the serial output 34 about the voltage produced by the voltage source 86. This is so because impedances 80 and 82 are coupled in parallel with the load, thus whatever voltage is imposed across the load is also imposed across the impedances 80 and 82. The impedances 80 and 82 provide a voltage divider circuit with each impedance having the same voltage imposed thereon (recall that the impedances are matched). Because the voltage source 86 is coupled to the interconnection of the impedances 80 and 82, the top terminal of the serial output is at a voltage one-half of the output voltage above the voltage source 86 and the bottom terminal of the serial output is at a voltage one-half of the output voltage below the voltage source 86, thus, the DC offset of the serial output is equal to the voltage source 86.

The bias circuit 22 also controls, to a degree, the magnitude of the serial output 34. To accomplish this, the load impedance needs to be known. In many applications of a TIA/EIA-644 LVDS transmitter the load is 100 ohms. In essence, the serial output voltage swing is determinable using Ohm's Law. By knowing the current that the first current source 18 is supplying and the second current source 20 is sinking, the impedance of the load, and the impedances 80 and 82, the output voltage can be determined. Thus, if the impedances are chosen to be 300 ohm resistors and the current of 4 mAmps, the output voltage is (4 mAmps)* [(600*100)/(600+100)]=345 mVolts.

Figure 3:
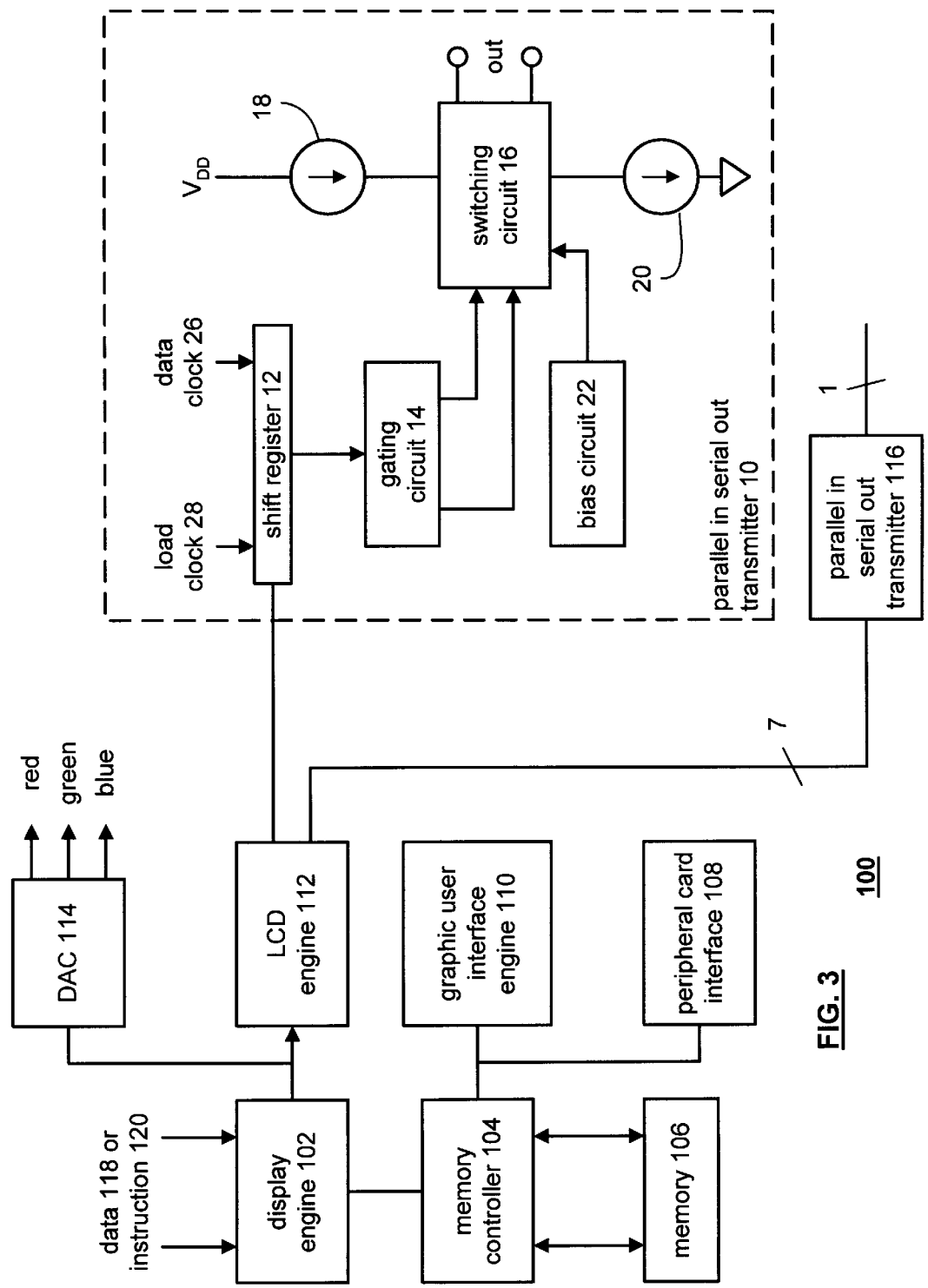
FIG. 3 illustrates a schematic block diagram of a video graphics circuit that includes a parallel input serial output transmitter which is in accordance with the present invention.

FIG. 3 illustrates a schematic block diagram of a video graphics circuit 100 that includes a display engine 102, an LCD (liquid crystal diode) engine 112, a digital to analog converter (DAC) 114, a memory controller 104, a peripheral card interface 108, a graphic user interface engine 110, memory 106, and at least one parallel input serial output transmitter 10 and 116. While the functions of many of these elements may be well known in the art, not requiring a detailed discussion of their operation, the combination of these elements with the transmitter of either FIG. 1 or 2, provides a video graphic circuit that had not yet been realized until the advent of the present invention.

When the display engine 102 receives data 118 and operational instructions 120, it determines, based on the operational instructions 120, whether the data 118 is to be displayed on a CRT display or an LCD display. For CRT display, the data 118 is routed to the DAC 114 which converts the data 118 into analog signals that represent red, green, and blue pixel information. If, however, the data 118 is intended to be displayed on an LCD display, the data is provided to the LCD engine 112. The LCD display engine 112 processes the data 118 and provides it to the transmitters 10 and 116. Note that for certain LCD displays, the LCD engine processes 28 bits of data per pixel which is transmitted by four seven-to-one transmitters 10 and 116. The transmitters 10 and 116 prepare the data for transmission as described with reference to FIG. 2.

Figure 4:
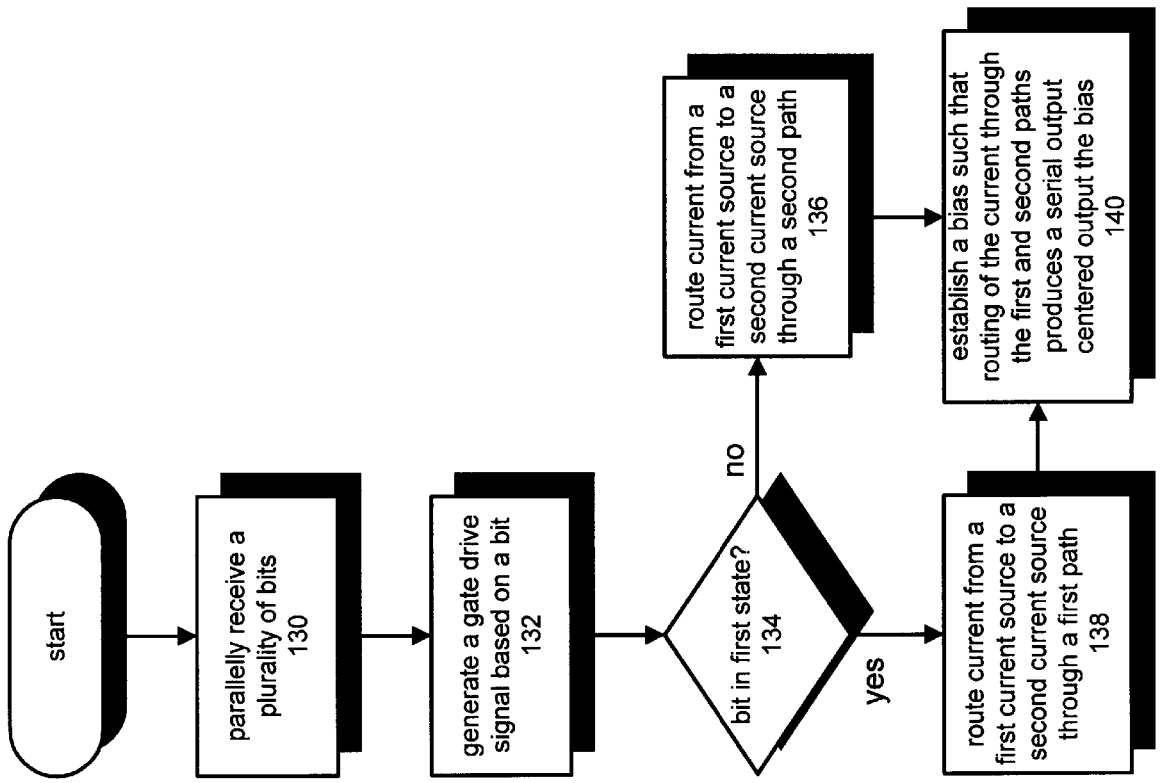
FIG. 4 illustrates a logic diagram that may be used to implement a parallel input to serial output transmission in accordance with the present invention.

FIG. 4 illustrates a logic diagram that may be used to implement a parallel input to serial output transmission in accordance with the present invention. The process begins at step 130, where a plurality of digital bits are received in parallel. The process then proceeds to step 132, where gate drive circuits are prepared from the a particular bit, i.e., the one currently being processed. The process then proceeds to step 134 where a determination is made as to whether the bit was in a first state. If yes, the process proceeds to step 138, where current is routed from a first current source to a second current source through a first path. If, however, the bit is not in the first state, the process proceeds to step 136, where the current is routed from the first current source to the second current source through a second path. Finally, at step 140, the current routed through the first and second paths, along with a bias, establish the serial output centered about the bias.

As described above, the present invention provides a method and apparatus that receives a plurality of bits in a parallel fashion and outputs them in a serial fashion. The parallel input serial output transmitter that performs these features includes a pair of current sources, a bias circuit, a gating circuit, and a switching circuit. By coupling the switching circuit between the two current sources, which are high impedance devices, the bias circuit can control the DC offset of the serial output as well as the magnitude of the serial output. With this type of configuration, the transmitters compliance with standard TIA/EIA-644 is easily achievable without having to rely on the conductive impedances of the transistors to provide the biasing and magnitude control.

We claim:

1. A parallel input serial output transmitter comprising:
   shift register that is operably coupled, in parallel to receive a plurality of digital bits;
   switching circuit;
   gating circuit operably coupled to the shift register and the switching circuit, wherein the switching circuit provides at least two drive signals to the gating circuit at a rate corresponding to a data rate;
   a first current source operably coupled to the switching circuit and a supply voltage source;
   a second current source operably coupled to the switching circuit and a supply return; and
   a bias circuit operably coupled to provide a bias voltage to the switching circuit, wherein the switching circuit provides a serial output of the plurality of digital bits.

2. The parallel input serial output transmitter of claim 1, wherein the serial output further comprises a pair of nodes that supports a differential signal approximately centered about the bias voltage.

3. The parallel input serial output transmitter of claim 1, wherein the switching circuit includes four transistors interoperably coupled to provide the serial output.

4. The parallel input serial output transmitter of claim 3, wherein the four transistors further comprise two cascaded pairs of transistors, wherein one of the cascaded pair of transistors is a p-channel transistor and the other one of the cascaded pair of transistors is an n-channel transistor.

5. The parallel input serial output transmitter of claim 4, wherein the gating circuit comprises a drive circuit that produces complementary drive signals of the least two drive signals for each transistor in the two cascaded pairs of transistors.

6. The parallel input serial output transmitter of claim 3, wherein the bias circuit comprises a voltage source and a pair of substantially matched cascaded impedances, wherein the voltage source is coupled to an interconnection of the substantially matched cascaded impedances and terminating ends of the substantially matched cascaded impedances are coupled to the serial output.

7. The parallel input serial output transmitter of claim 1, wherein the gating circuit comprises a complementary drive circuit that generates a first drive signal of the at least two drive signals when a digital bit of the plurality of digital bits that is currently be outputted is in a first state and generates a second drive signal of the at least two drive signals when the digital bit is in a second state.

8. A video graphics circuit comprising:
   display engine that processes display data based on display operational instructions;
   memory controller operably coupled to the display engine and to read/write data from/to an external memory;
   graphic user interface engine operably coupled to the memory controller;
   peripheral card interface operably coupled to the graphic user interface and the memory controller;
   an LCD engine operably coupled to the display engine; and
   a parallel input serial output transmitter operably coupled to the LCD engine comprising:
   shift register that is operably coupled, in parallel to receive a plurality of digital bits;
   switching circuit;
   gating circuit operably coupled to the shift register and the switching circuit, wherein the gating circuit provides at least two drive signals to the gating circuit at a rate corresponding to a data rate;
   a first current source operably coupled to the switching circuit and a supply voltage source;

a second current source operably coupled to the switching circuit and a supply return; and a bias circuit operably coupled to provide a bias voltage to the switching circuit, wherein the switching circuit provides a serial output of the plurality of digital bits.

9. The video graphics circuit of claim 8 further comprises a digital to analog converter operably coupled to the display engine, wherein the digital to analog converter provides red, green, and blue pixel information to a video display device.

10. The video graphics circuit of claim 8, wherein the shift register is further coupled to receive a first clock signal and a second clock signal, the first clock signal has a rate substantially equal to the data rate and the second clock signal has a rate substantially equal to the data rate divided by number of bits contained in the plurality of digital bits.

11. The video graphics circuit of claim 8 further comprises a second parallel input serial output transmitter operably coupled to the LCD engine.

12. A method for receiving digital bits in a parallel manner and providing a serial output of the digital bits, the method comprising the steps of:

a) the parallel receiving of a plurality of digital bits;

b) for a bit of the plurality of digital bits, generating a gate drive signal based on state of the bit;

c) routing current from a first current source to a second current source through a first path when the gate drive signal is generated based on the bit being in a first state;

d) routing current from the first current source to the second current source through a second path when the gate drive signal is generated based on the bit being in a second state; and e) establishing a bias such that the routing of the current through the first and second paths produces a serial output signal centered about the bias.

* * * * *